(12) United States Patent
Juang (10) Patent No.: US 10,949,443 B2
(45) Date of Patent: Mar. 16, 2021

(54) METHOD AND SYSTEM FOR SAMPLING AND CONVERTING VEHICULAR NETWORK DATA (71) Applicant: Automotive Research & Testing Center, Changhua Hsien (TW)

(72) Inventor: Rong-Terng Juang, Changhua Hsien (TW)

(73) Assignee: Automotive Research & Testing Center, Changhua Hsien (TW)

( * ) Notice: Subject to any disclaimer, the term of this patent is extended or adjusted under 35 U.S.C. 154(b) by 186 days.

(21) Appl. No.: 16/211,368

(22) Filed: Dec. 6, 2018

(65) Prior Publication Data
US 2020/0183949 A1 Jun. 11, 2020

(51) Int. Cl.
*G06F 7/00* (2006.01)
*G06F 16/25* (2019.01)
*H04L 12/40* (2006.01)
*G06F 16/22* (2019.01)
*H03M 7/30* (2006.01)
*G06F 16/215* (2019.01)
*H04L 29/08* (2006.01)

(52) U.S. Cl.
CPC .......... *G06F 16/258* (2019.01); *G06F 16/215* (2019.01); *G06F 16/2282* (2019.01); *H03M 7/30* (2013.01); *H04L 12/40* (2013.01); *H04L 67/10* (2013.01); *H04L 2012/40215* (2013.01); *H04L 2012/40273* (2013.01)

(58) Field of Classification Search
CPC .. G06F 16/258; G06F 16/215; G06F 16/2282; H03M 7/30; H04L 12/40; H04L 67/10; H04L 2012/40215; H04L 2012/40273
USPC .................................................. 707/600–899
See application file for complete search history.

(56) References Cited

U.S. PATENT DOCUMENTS 5,626,344 A   5/1997  Huang
8,010,704 B2  8/2011  Stengelin
2018/0359228 A1* 12/2018 Lerner .................. H04L 9/0825

* cited by examiner

*Primary Examiner* — Isaac M Woo
(74) *Attorney, Agent, or Firm* — Alan D. Kamrath; Karin L. Williams; Mayer & Williams PC (57) ABSTRACT

A method for sampling and converting vehicular network data is executed by a vehicle host. The vehicle host selects one of multiple data signals from an original signal, and establishes a data table. The vehicle host further determines whether the original signal includes any data signal remaining unselected. When the original signal does not include any data signal remaining unselected, the vehicle host differentially samples data in the data table corresponding to other time sequences by using the data in the data table corresponding to a first time sequence as a reference to generate a differential data table, and compresses the differential data table. The method can reduce the amount of data by performing differential sampling, so that the compression ratio of the data can be effectively improved, and the delay of data transmission can be avoided.

14 Claims, 11 Drawing Sheets

| SERIAL NUMBER | 0 | 1 | 2 | ... | n |
|---|---|---|---|---|---|
| ID DATA | $CID_0$ | $CID_1$ | $CID_2$ | ... | $CID_n$ |
| LENGTH DATA | $CLD_0$ | $CLD_1$ | $CLD_2$ | ... | $CLD_n$ |

METHOD AND SYSTEM FOR SAMPLING AND CONVERTING VEHICULAR NETWORK DATA

BACKGROUND OF THE INVENTION

1. Field of the Invention

The invention relates to a method and a system for sampling and converting vehicular network data, and more particularly to a method and a system for sampling and converting vehicular network data to improve data compression rate.

2. Description of the Related Art

Multiple electronic devices can communicate with each other by transmitting data to one another. In the process of data transmission, due to limitation of the software and the hardware technologies, data can only be transmitted at a limited speed.

Therefore, in computer science and information theory, a data compression technology has been developed to achieve the purpose of transmitting more data at the limited speed. The data compression technology refers to a process of representing information according to a specific encoding method, and encoding the information using fewer bits of data than the original representation. Namely, the original data is compressed by the specific encoding method to reduce the amount of original data. For example, the ZIP file format is a compressed file format, which not only provides compression, but also serves as an archiving tool that can store many files in one compressed file.

However, with the development of the technology, the amount of the data, such as high-definition digital audio and video files, is now getting larger and larger. Therefore, a common data compression method is not enough to compress the data for smoothly transmitting without delay. Namely, the time for transmitting the data will be too long, resulting in a delay in the data transmission. The user must wait until the data is fully transmitted, and then the user can continue to use the electronic device to perform subsequent functions.

For example, U.S. Pat. No. 8,010,704 B2 discloses a compression method for Controller Area Network (CAN) data using a vehicle. The compression method mainly encodes the CAN data, and groups the CAN data in multiple groups by using one Byte as a unit. The compression method further compresses the groups, but the above mentioned compression method still has the following problems.

1. The compression method can only compresses the CAN data, but cannot be applied to Light Detection and Ranging (Lidar) data compression.

2. Since the compression method groups the CAN data in multiple groups by using one Byte as the unit and compresses the groups, the complexity of the processor pre-operation is increased.

SUMMARY OF THE INVENTION

An objective of the present invention is to provide a method and a system for sampling and converting vehicular network data to be applied to Lidar data compression and to reduce the complexity of the processor pre-operation.

The method for sampling and converting the vehicular network data includes steps of:

receiving an original signal; wherein the original signal includes a plurality of data signals;

selecting one of the data signals from the original signal;

establishing a data table according to the selected one of the data signals;

determining whether the original signal includes any data signal remaining unselected;

when the original signal includes any data signal remaining unselected, selecting another one of the data signals from the data signals of the original signal remaining unselected;

when the original signal does not include any data signal remaining unselected, differentially sampling data in the data table corresponding to other time sequences by using the data in the data table corresponding to a first time sequence as a reference to generate a differential data table, compressing the differential data table, and uploading the compressed differential data table.

The system for sampling and converting the vehicular network data includes a vehicle bus, a vehicle host, and a network module.

The vehicle bus receives an original signal, and the original signal includes a plurality of data signals.

The vehicle host is electrically connected to the vehicle bus, and selects one of the data signals from the original signal. The vehicle host further establishes a data table according to the selected one of the data signals, and determines whether the original signal includes any data signal remaining unselected.

When the original signal includes any data signal remaining unselected, the vehicle host selects another one of the data signals from the data signals of the original signal remaining unselected.

When the original signal does not include any data signal remaining unselected, the vehicle host differential samples data in the data table corresponding to other time sequences by using the data in the data table corresponding to a first time sequence as a reference to generate a differential data table, and compresses the differential data table.

The network module is electrically connected to the vehicle host. When the vehicle host compresses the differential data table, the vehicle host further uploads the compressed differential data table to a cloud server.

The method for sampling and converting the vehicular network data of the present invention firstly differential samples data in the data table corresponding to other time sequences by using the data in the data table corresponding to the first time sequence as the reference to generate the differential data table, and secondly compresses and uploads the differential data table. Therefore, an amount of data of the differential data table is less than the amount of data of the data table or the amount of data of the original signal. Further, a compression ratio of the original signal is increased, the complexity of the pre-operation is reduced, and the delay of data transmission can also be avoided. Moreover, the present invention can also be applied to the Lidar data.

DETAILED DESCRIPTION OF THE INVENTION

Figure 1:
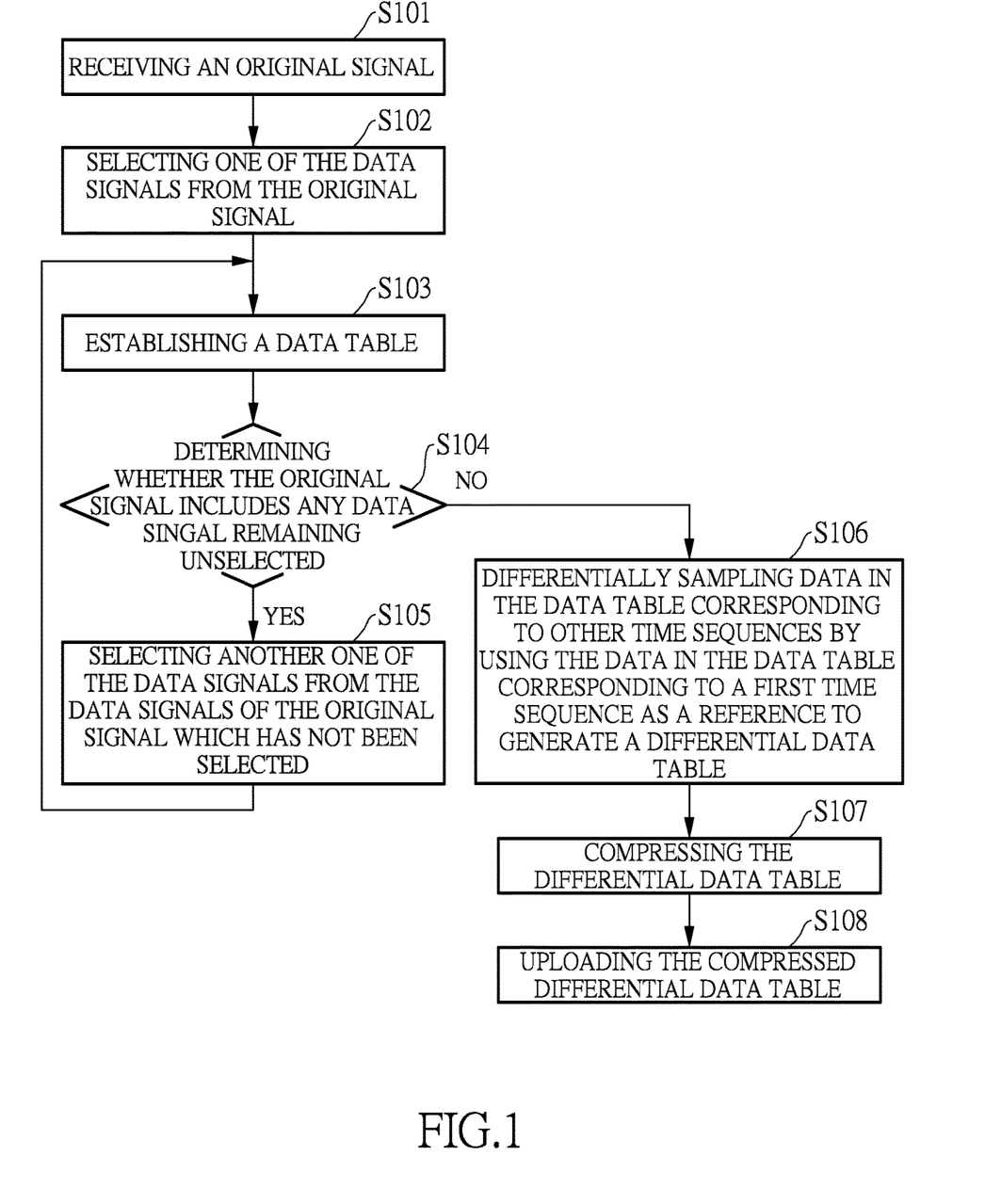
FIG. 1 is a flowchart of a first embodiment of a method for sampling and converting vehicular network data of the present invention.

With reference to FIG. 1, the present invention is to provide a method and a system for sampling and converting vehicular network data. A first embodiment of the method for sampling and converting the vehicular network data includes steps of:

receiving an original signal (S101); wherein the original signal includes a plurality of data signals;

selecting one of the data signals from the original signal (S102);

establishing a data table according to the selected one of the data signals (S103);

determining whether the original signal includes any data signal remaining unselected (S104);

when the original signal includes any data signal remaining unselected, selecting another one of the data signals from the data signals of the original signal remaining unselected (S105);

when the original signal does not include any data signal remaining unselected, differentially sampling data in the data table corresponding to other time sequences by using the data in the data table corresponding to a first time sequence as a reference to generate a differential, data table (S106), compressing the differential data table (S107), and uploading the compressed differential data table (S108).

The method for sampling and converting the vehicular network data of the present invention firstly differential samples data in the data table corresponding to other time sequences by using the data in the data table corresponding to the first time sequence as the reference to generate the differential data table, and secondly compresses and uploads the differential data table. Therefore, an amount of data of the differential data table is less than the amount of data of the data table or the amount of data of the original signal. Further, a compression ratio of the original signal is increased, the complexity of the pre-operation is reduced, and the delay of information transmission can also be avoided. Moreover, the present invention can also be applied to Light Detection and Ranging (Lidar) data.

In the embodiment, the method for sampling and converting the vehicular network data is executed by a vehicle host to compress the original signal of a vehicle, and to increase the compression ratio of the original signal. Therefore, a speed rate for uploading the original signal to a cloud server can be increased. Further, in the step S107, the differential data table is compressed by the Huffman coding, the Arithmetic coding, the Symbol coding, or the Codebook coding, to encode binary data of the differential data table.

For example, the data table is $[y_1\ y_2\ y_3\ \ldots\ y_n]^T$, $[y_1]^T$ is the data in the data table corresponding to the first time sequence, and the differential data table is $[y_1\ y_2-y_1\ y_3-y_2\ \ldots\ y_n-y_{n-1}]^T$. Further, since the amount of differential data is less than the amount of original data, such as $y_t-y_{t-1} \ll t_t$, the amount of data of the differential data table is less than the amount of data of the data table or the amount of data of the original signal. Moreover, the compression ratio of the original signal is increased, the complexity of the pre-operation is reduced, and the delay of data transmission can also be avoided. For further example, the data table is $[10000\ 10005\ 10006\ 10010\ 10012]^T$, and the differential data table is $[10000\ 5\ 1\ 4\ 2]^T$.

Figure 2:
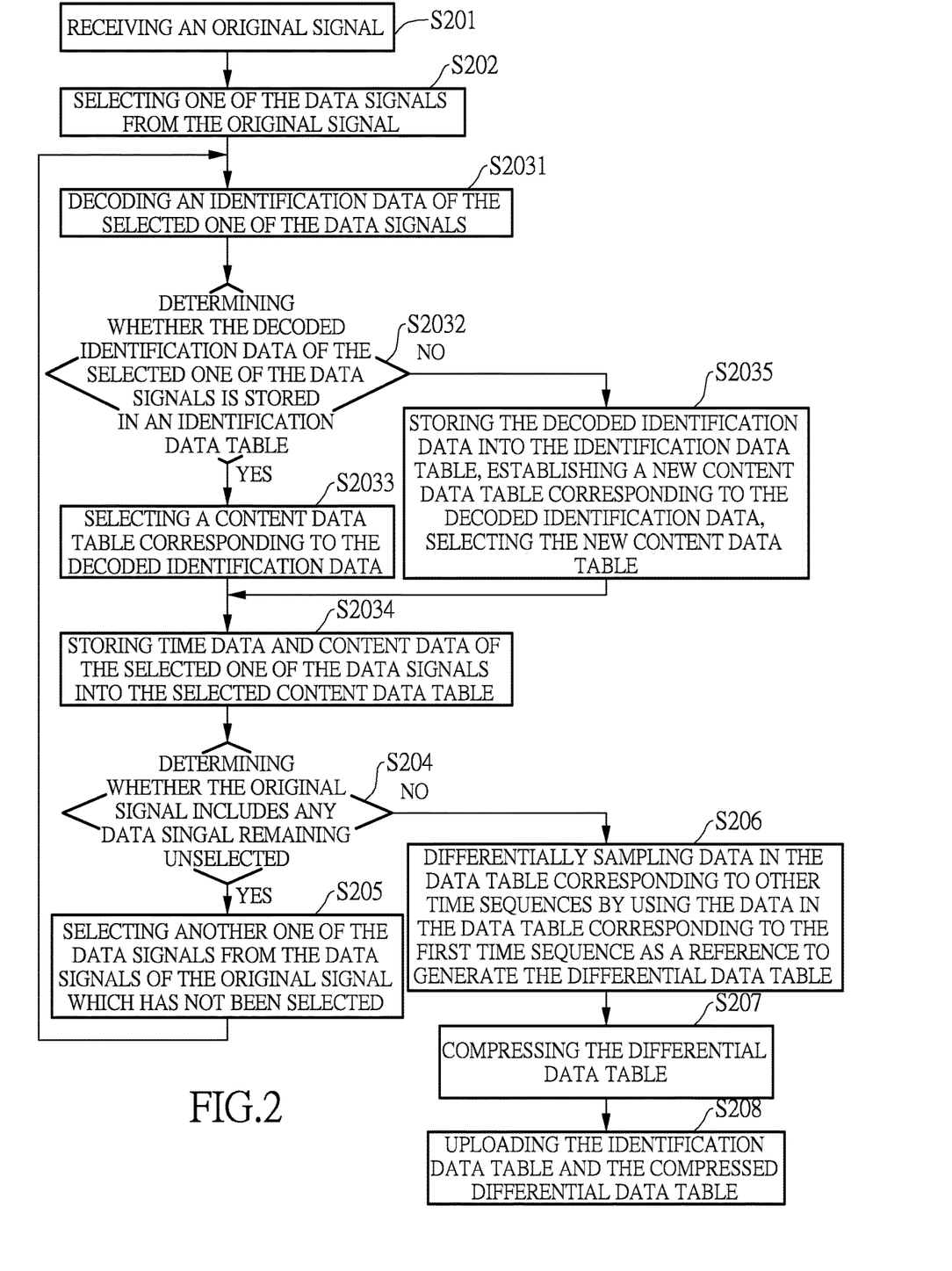
FIG. 2 is a flowchart of a second embodiment of the method for sampling and converting the vehicular network data of the present invention.

With reference to FIG. 2, a second embodiment of the method for sampling and converting the vehicular network data includes the same steps as the first embodiment, but in the second embodiment, the original signal is a Controller Area Network (CAN) signal. Further, the step S103 includes sub-steps of:

decoding an identification data of the selected one of the data signals (S2031);

determining whether the decoded identification data of the selected one of the data signals is stored in an identification data table (S2032);

when the decoded identification data of the selected one of the data signals is stored in the identification data table, selecting a content data table corresponding to the decoded identification data (S2033), and storing time data and content data of the selected one of the data signals into the selected content data table (S2034);

when the decoded identification data of the selected one of the data signals is not stored in the identification data table, storing the decoded identification data into the identification data table, establishing a new content data table corresponding to the decoded identification data, selecting the new content data table (S2035), and storing time data and content data of the selected one of the data signals into the selected content data table (S2034).

In addition, in the second embodiment, when the original signal does not include any data signal remaining unselected, the method further includes steps of:

differentially sampling data in the data table corresponding to other time sequences by using the data in the data table corresponding to the first time sequence as a reference to generate the differential data table (S206), compressing the differential data table (S207), and uploading the identification data table and the compressed differential data table (S208).

Figure 3:
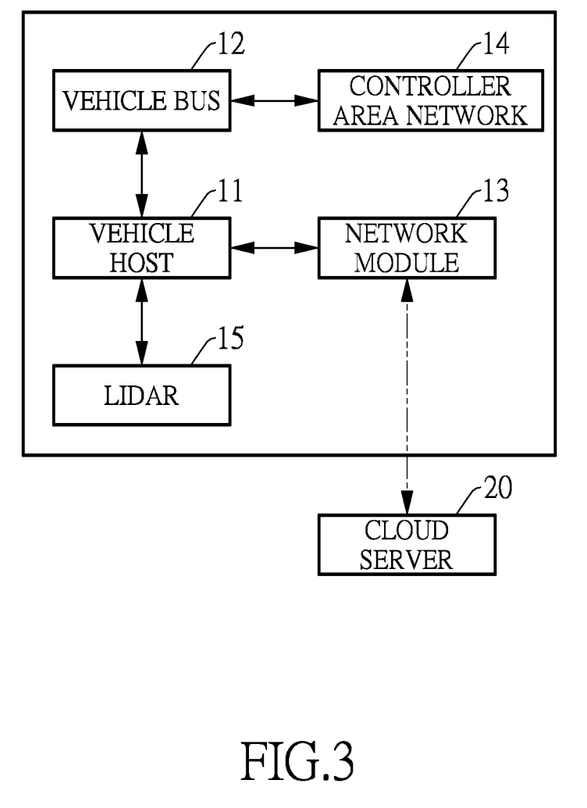
FIG. 3 is a block diagram of a system for sampling and converting the vehicular network data of the present invention.

With reference to FIG. 3, the second embodiment of the method for sampling and converting the vehicular network data of the present invention is executed by a system for sampling and converting the vehicular network data. The system for sampling and converting the vehicular network data includes a vehicle host 11, a vehicle bus 12, and a network module 13. The vehicle host 11 is electrically connected to a Controller Area Network (CAN) 14 through the vehicle bus 12 to receive the CAN signal. The vehicle host 11 is used to execute the method for sampling and converting the vehicular network data, and the vehicle host 11 uploads the identification data table to a cloud server 20 through the network module 13.

Figure 4:
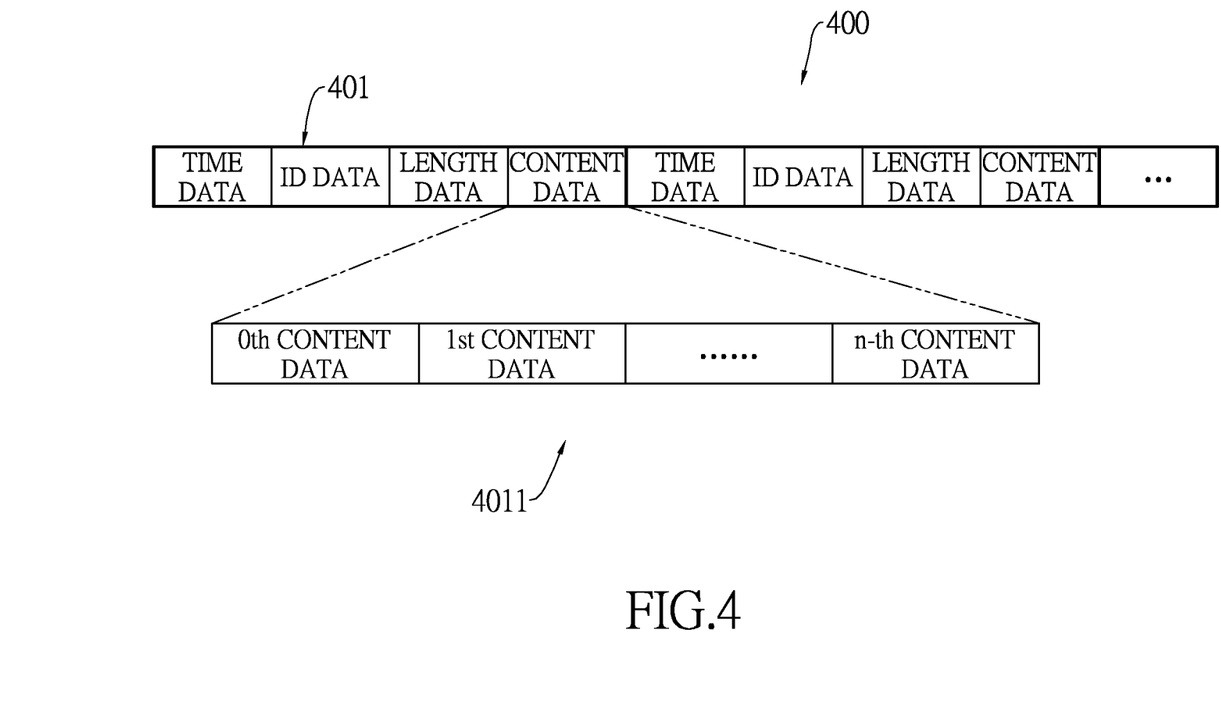
FIG. 4 is a schematic diagram of a Controller Area Network (CAN) signal and content data of the second embodiment of the method for sampling and converting the vehicular network data of the present invention.

For example, with reference to FIG. 4, the CAN signal 400 includes a plurality of data signals 401, and the data signals 401 each include time data, identification data, length data, and content data 4011. The content data 4011 consists of content sub-data, such as $0^{th}$ content sub-data, $1^{st}$ content sub-data, $2^{nd}$ content sub-data, . . . , $n^{th}$ content sub-data.

Figure 5:
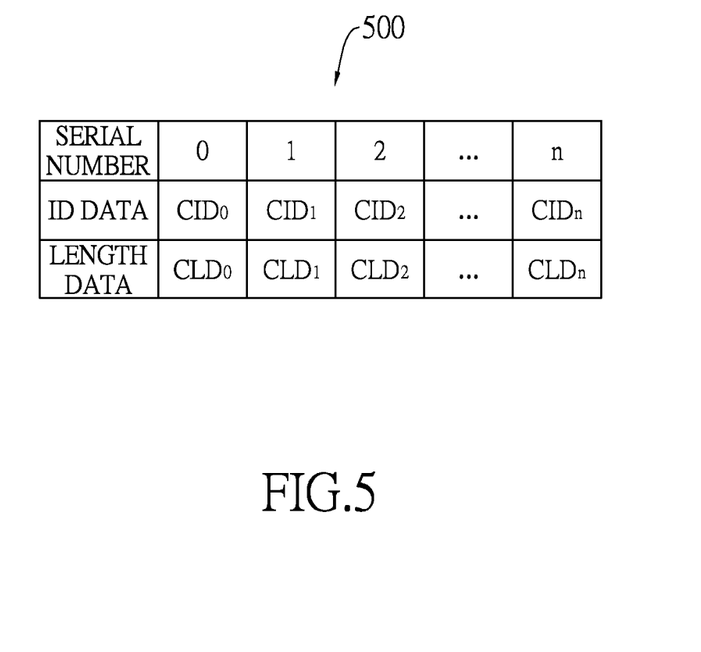
FIG. 5 is a schematic diagram of an identification data table of the second embodiment of the method for sampling and converting the vehicular network data of the present invention.

When the vehicle host 11 receives the CAN signal and selects one of the data signals 401 from the CAN signal, the vehicle host 11 decodes the identification data of the selected one of the data signals 401. The vehicle host 11 further determines whether the decoded identification data of the selected one of the data signals is stored in the identification data table. Further with reference to FIG. 5, the identification data table 500 stores contents of the identification data, such as $CID_0$, $CID_1$, $CID_2$. The identification data is identification codes of controllers of the CAN 14, and the vehicle host 11 can determine that the CAN signal is generated by which controller. Therefore, when the vehicle host 11 determines that the identification data is stored in the identification data table 500, the CAN signal is generated by a determined controller, and the CAN signal generated by the determined controller has been stored in the identification data table 500.

Figure 6:
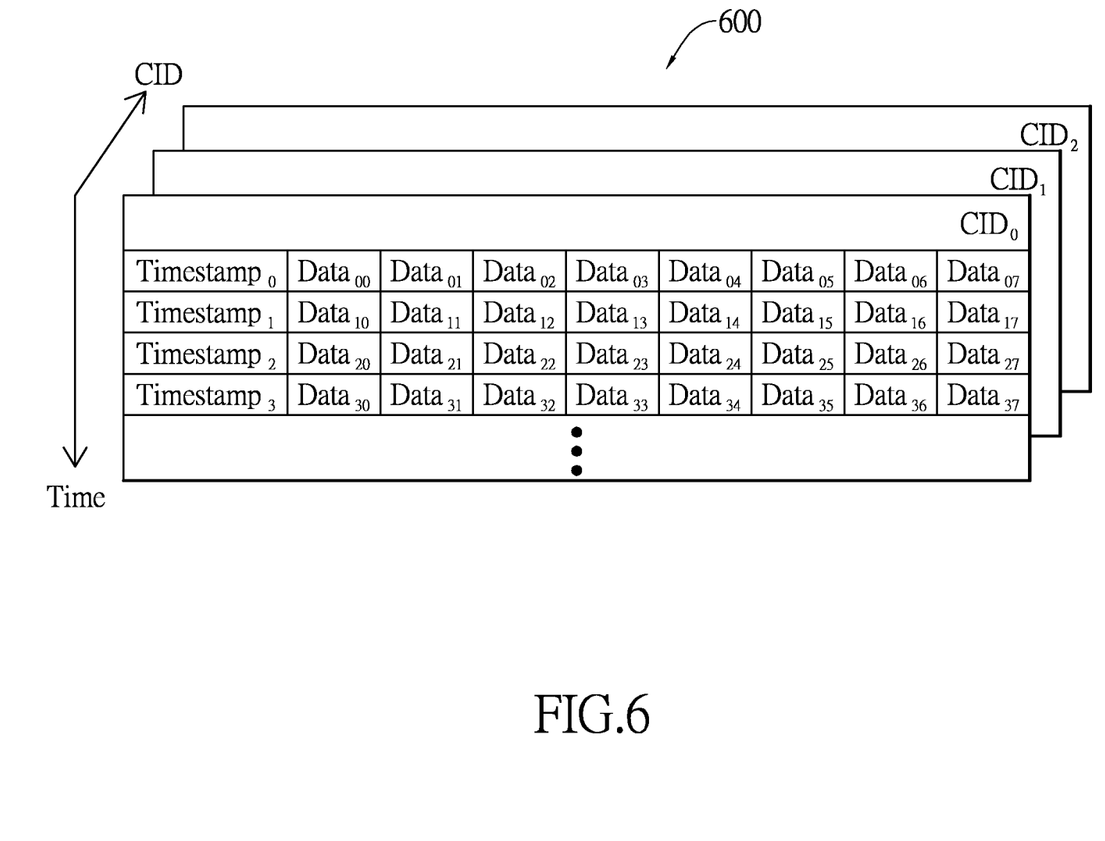
FIG. 6 is a schematic diagram of a content data table of the second embodiment of the method for sampling and converting the vehicular network data of the present invention.

For example, the vehicle host 11 determines that the identification data is $CID_0$. Since $CID_0$ has been stored in the identification data table 500, the vehicle host 11 selects the content data table corresponding to $CID_0$. With reference to FIG. 6, the identification data table 600 has stored the time data, such as $Timestamp_0$, and the content data, such as $Data_{00}$ to $Data_{07}$, generated by the controller corresponding to $CID_0$. Therefore, the vehicle host 11 can store the time data, such as $Timestamp_n$, and the content data, such as $Data_{n0}$ to $Data_{n7}$, corresponding to the selected one of the data signals 101 into the selected content data table 600.

However, when the vehicle host 11 determines that the identification data has not been stored in the identification data table, the identification data is generated by an undetermined controller. Namely, the data signal corresponding to the undetermined controller has not been stored. Therefore, the vehicle host 11 stores the identification data, such as $CID_n$, $DLC_n$, into the identification data table, establishes a new content data table 60 corresponding to the identification data, and stores time data, such as $Timestamp_0$, and content data, such as $Data_{00}$ to $Data_{07}$, of the selected one of the data signals into the new content data table 600 corresponding to $CID_n$.

Through the above-mentioned method for establishing the content data table 600, the original data can be converted into a data space based on time, space and data code, thereby effectively reducing data disorder.

In addition, the data in the content data table 600 are arranged in the order of the time data. The data signal generated by the controller of the CAN 14 is time-varying, such as the speed of the vehicle, and the data stored in the content data table 600 corresponds to the same controller. Therefore, the data signals generated by the same controller are arranged in time series according to the time data, and the data of each controller can be clearly recorded.

Moreover, when the vehicle host 11 differentially samples data in the data table, the vehicle host 11 uses the data in the data table corresponding to the first time sequence as the reference, and the vehicle host 11 differentially samples the data in the data table corresponding to other time sequences except for the first time sequence. For example, when the vehicle host 11 differentially samples the content data table 600 shown in FIG. 6, the data in the data table corresponding to the first time sequence are the time data $Timestamp_0$, and the content data $Data_{00}$ to $Data_{07}$. Therefore, with reference to FIG. 7, the vehicle host 11 uses the time data $Timestamp_0$ and the content data $Data_{00}$ to $Data_{07}$ as the reference, and the vehicle host 11 differentially samples the time data $Timestamp_1$ to $Timestamp_3$ and the content data $Data_{10}$ to $Data_{37}$ to generate the differential data table 600a.

Figure 7:
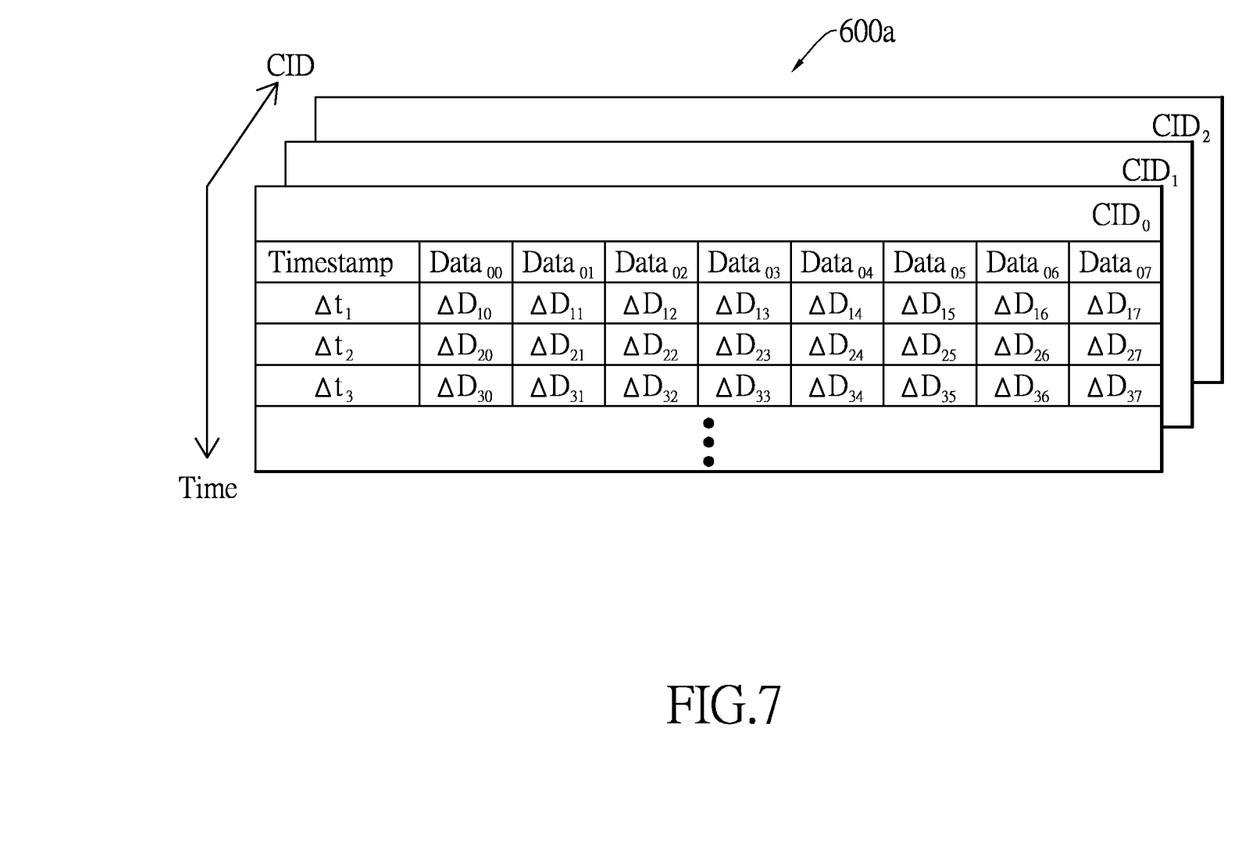
FIG. 7 is a schematic diagram of a content differential data table of the second embodiment of the method for sampling and converting the vehicular network data of the present invention.

For example, the differential time data in the differential data table 600a are $\Delta t_1 = Timestamp_1 - Timestamp_0$, $\Delta t_2 = Timestamp_2 - Timestamp_1$, . . . , etc, and differential content data in the differential data table 600a are $\Delta D_{10} = Data_{10} - Data_{00}$, and $\Delta D_{20} = Data_{20} - Data_{10}$, . . . , etc.

Figure 8:
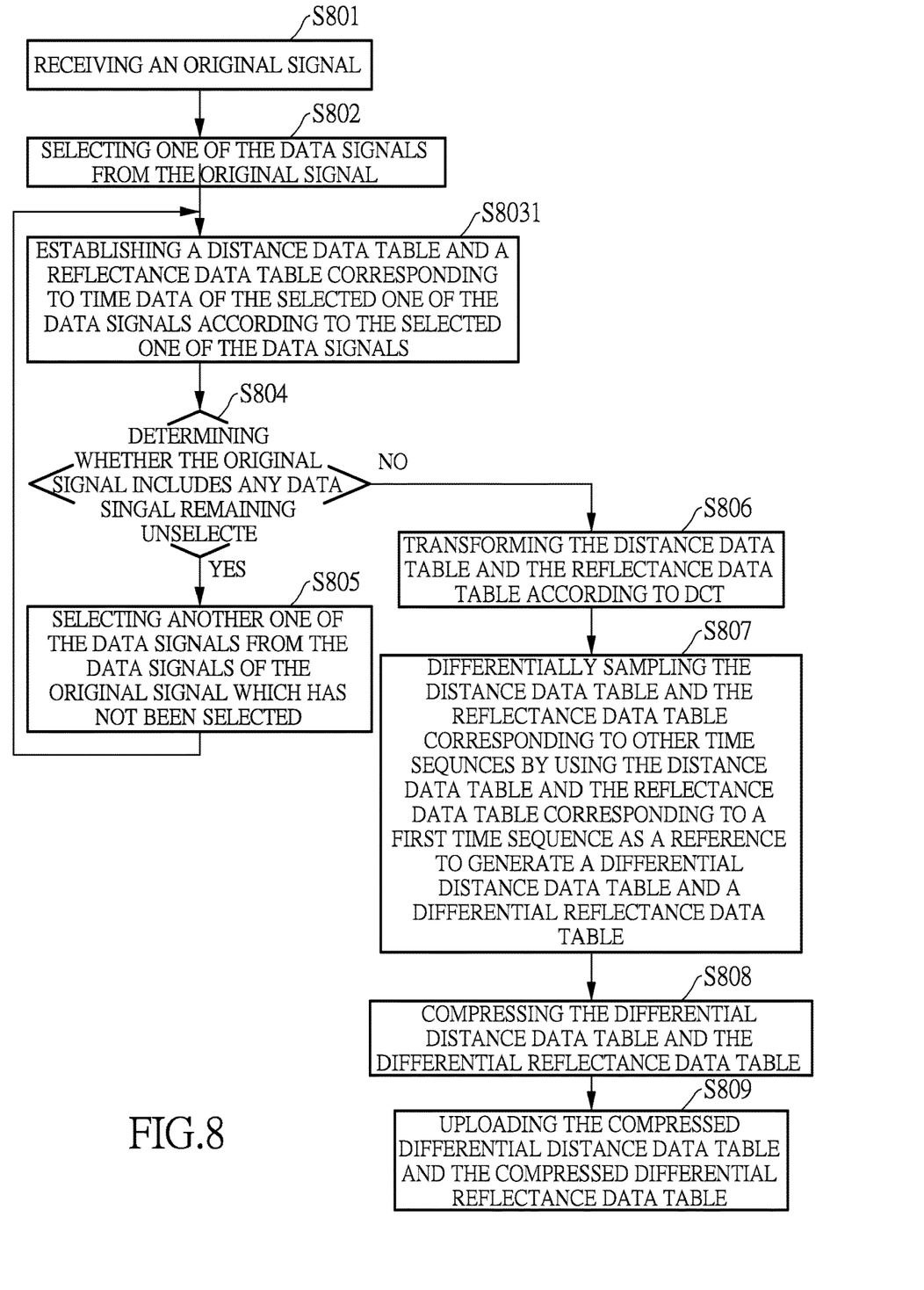
FIG. 8 is a flowchart of a third embodiment of the method for sampling and converting the vehicular network data of the present invention.

With reference to FIG. 8, a third embodiment of the method for sampling and converting the vehicular network data of the present invention includes the same steps as the first embodiment, but in the third embodiment, the original signal is a Light Detection and Ranging (Lidar) signal. Further, the step S103 includes sub-steps:

establishing a distance data table and a reflectance data table corresponding to time data of the selected one of the data signals according to the selected one of the data signals (S8031).

Further, when the original signal does not include the data signal remaining unselected, the method further includes firstly transforming the distance data table and the reflectance data table according to Discrete Cosine Transform (DCT) (S806), secondly differentially sampling the distance data table and the reflectance data table corresponding to other time sequences by using the distance data table and the reflectance data table corresponding to a first time sequence as a reference to generate a differential distance data table and a differential reflectance data table (S807), thirdly compressing the differential distance data table and the differential reflectance data table (S808), and fourthly uploading the compressed differential distance data table and the compressed differential reflectance data table (S809).

With reference to FIG. 3, the third embodiment of the method for sampling and converting the vehicular network data of the present invention is also executed by the system for sampling and converting the vehicular network data, and the system for sampling and converting the vehicular network data further includes a Light Detection and Ranging (Lidar) 15. The Lidar 15 generates the Lidar signal, and transmits the Lidar signal to the vehicle host 11. Namely, the original signal is the Lidar signal generated by the Lidar 15. The vehicle host 11 executes the third embodiment of the method for sampling and converting the vehicular network data, and the vehicle host 11 uploads the compressed differential distance data table and the compressed differential reflectance data table to the cloud server 20 through the network module 13.

Figure 9:
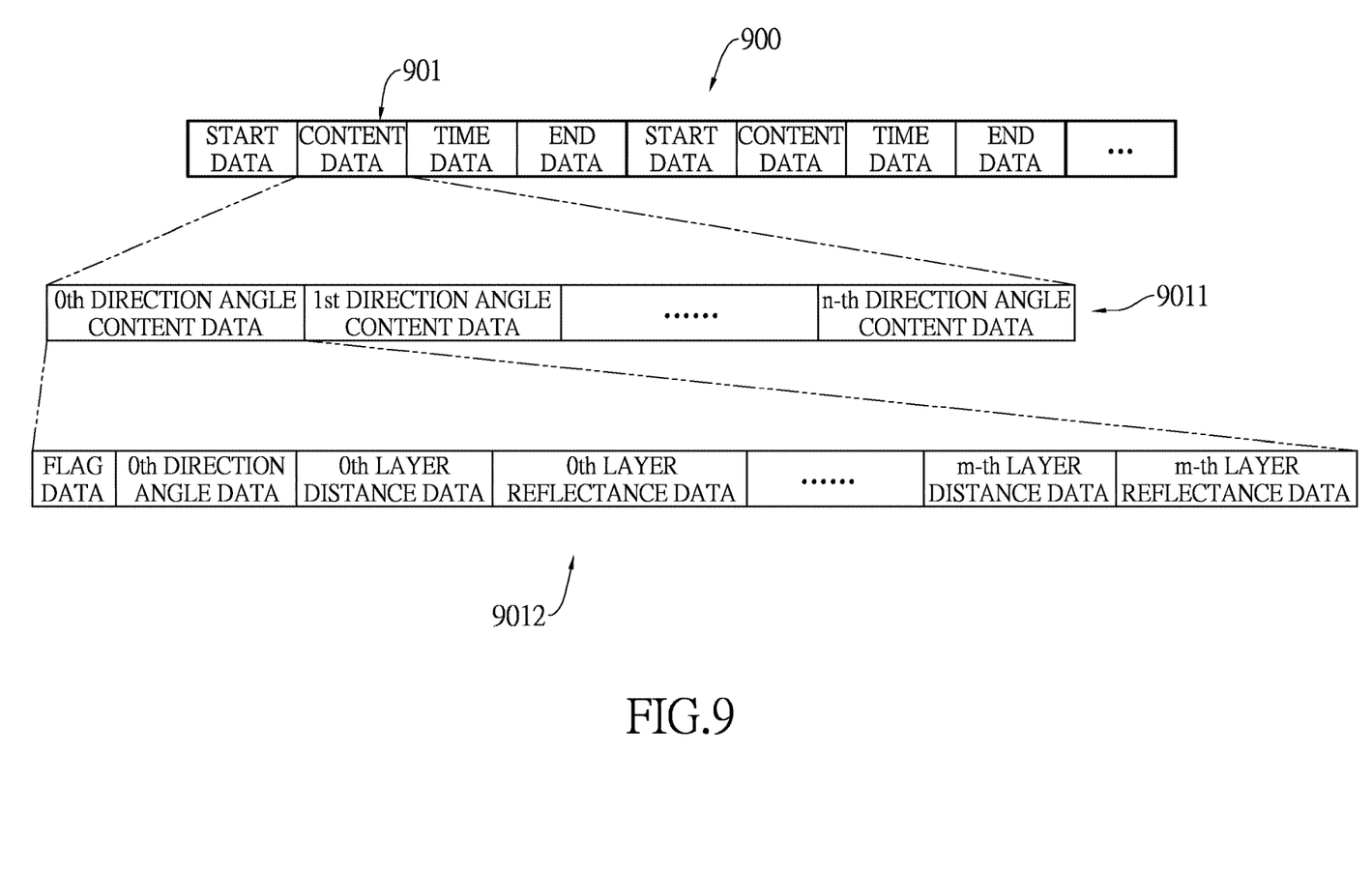
FIG. 9 is a schematic diagram of a Lidar signal, content data, and direction angle content data of the third embodiment of the method for sampling and converting the vehicular network data of the present invention.

For example, with reference to FIG. 9, the Lidar signal 900 includes a plurality of content signals 901, and the content signals 901 each include start data, content data 9011, time data, and end data. The content data 9011 consists of direction angle content data 9012, such as $0^{th}$ direction angle content data, $1^{st}$ direction angle content data, $2^{nd}$ direction angle content data, ..., $n^{th}$ direction angle content data. The direction angle content data consists of flag data, direction angle data, distance data, and reflectance data. For example, the $0^{th}$ direction angle content data includes flag data, $0^{th}$ direction angle data, $0^{th}$ layer distance data, $0^{th}$ layer reflectance data, $1^{st}$ layer distance data, $1^{st}$ layer reflectance data, ..., $m^{th}$ layer distance data, and $m^{th}$ layer reflectance data.

Figure 10:
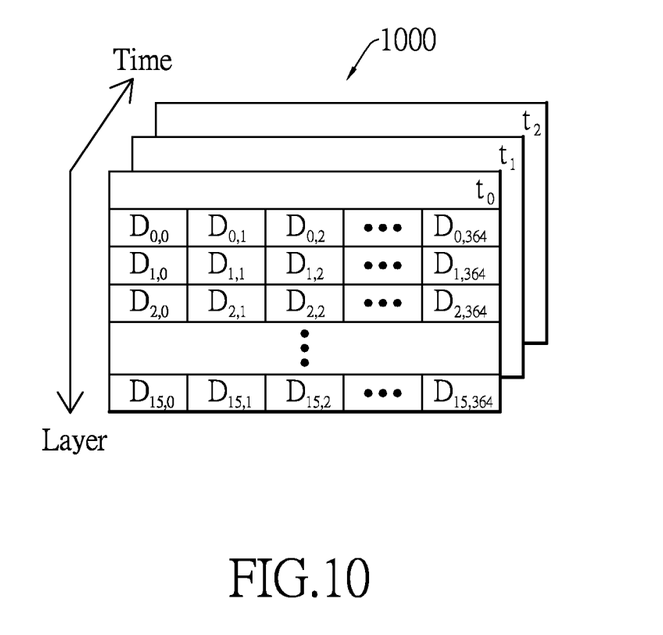
FIG. 10 is a schematic diagram of a distance data table of the third embodiment of the method for sampling and converting the vehicular network data of the present invention.
Figure 11:
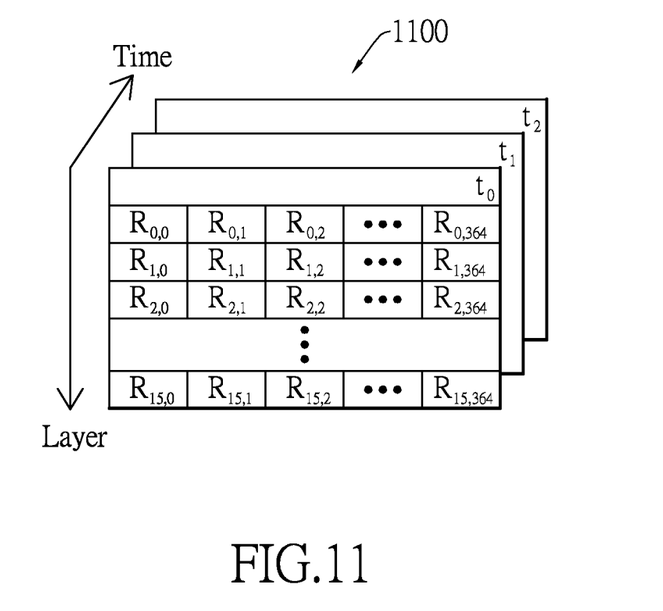
FIG. 11 is a schematic diagram of a reflectance data table of the third embodiment of the method for sampling and converting the vehicular network data of the present invention.

When the vehicle host 11 receives the Lidar signal 900 and selects one of the content signals 901, the vehicle host 11 firstly processes, the $0^{th}$ direction angle content data to generate the distance data table 1000 as shown in FIG. 10 and the reflectance data table 1100 as shown in FIG. 11.

The distance data table 1000 is taken as an example. The content data 9011 includes $0^{th}$ direction angle content data, $1^{st}$ direction angle content data, $2^{nd}$ direction angle content data, ..., $n^{th}$ direction angle content data, for representing data corresponding to different direction angles. The $0^{th}$ direction angle content data, $1^{st}$ direction angle content data, $2^{nd}$ direction angle content data, ..., $n^{th}$ direction angle content data, each include $0^{th}$ layer distance data, $0^{th}$ layer reflectance data, $1^{st}$ layer distance data, $1^{st}$ layer reflectance data, ..., $m^{th}$ layer distance data, and $m^{th}$ layer reflectance data. Therefore, the $0^{th}$ direction angle content data, $1^{st}$ direction angle content data, $2^{nd}$ direction angle content data, ..., and $n^{th}$ direction angle content data each can establish one completed distance data table 1000 and one completed reflectance data table.

When the distance data table is established, the number of the layer of the distance data is taken as the vertical axis of the distance data table, and the direction angle data corresponding to the distance data is taken as the horizontal axis of the distance data table. For example, the $0^{th}$ layer distance data of the $0^{th}$ direction angle content data is stored as $D_{0,0}$ in the distance data table 1000, and the $15^{th}$ layer distance data of the $0^{th}$ direction angle content data is stored as $D_{15,0}$ in the distance data table 1000. Further, the $15^{th}$ layer distance data of the $364^{th}$ direction angle content data is stored as $D_{15,364}$ in the distance data table 1000. Since the content data 9011 is each respectively corresponding to the time data, the distance data tables 1000 are also each respectively corresponding to the time data $t_0$ to $t_2$.

The manner in which the reflection data table 1100 is established is the same as the manner in which the distance data table 1000 is established, and details are not described herein again.

When all the data signals have been selected, and the corresponding distance data tables 1000 and the corresponding reflection data tables 1100 are established, the vehicle host 11 further respectively performs the DCT to the distance data tables 1000 and the reflection data tables 1100.

Therefore, the distance data tables 1000 and the reflection data tables 1100 are converted from the time domain into the frequency domain.

In the embodiment, the DCT is performed by the following formula:

$$F(u, v) = \sqrt{\frac{2}{N}} \sqrt{\frac{2}{M}} \sum_{i=0}^{N-1} \sum_{j=0}^{M-1} C_U(u) C_V(v) \cos\left[\frac{\pi u}{2N}(2i+1)\right] \cos\left[\frac{\pi v}{2M}(2j+1)\right] f(i, j)$$

$$C_U(u) = \begin{cases} \frac{1}{\sqrt{2}} & \text{if } u = 0 \\ 1 & \text{else} \end{cases}, \quad C_V(v) = \begin{cases} \frac{1}{\sqrt{2}} & \text{if } v = 0 \\ 1 & \text{else} \end{cases}$$

$f(i,j)$ represents the data in the distance data tables 1000 and the reflection data tables 1100.

Figure 12:
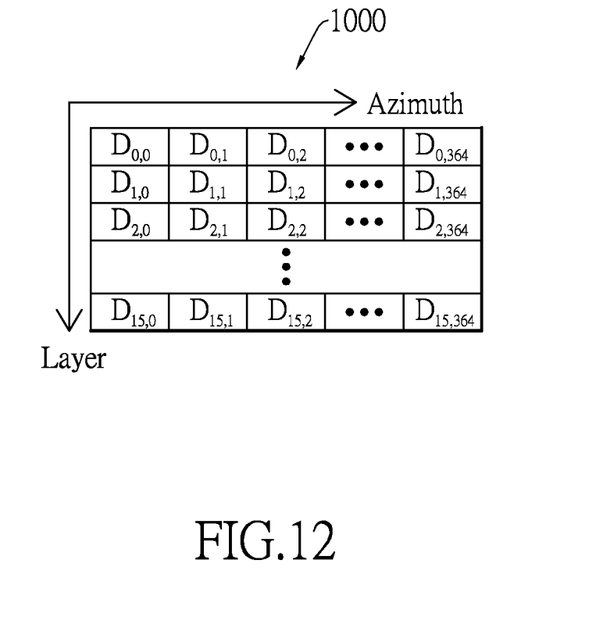
FIG. 12 is a schematic diagram of one of the distance data tables of the third embodiment of the method for sampling and converting the vehicular network data of the present invention.
Figure 13:
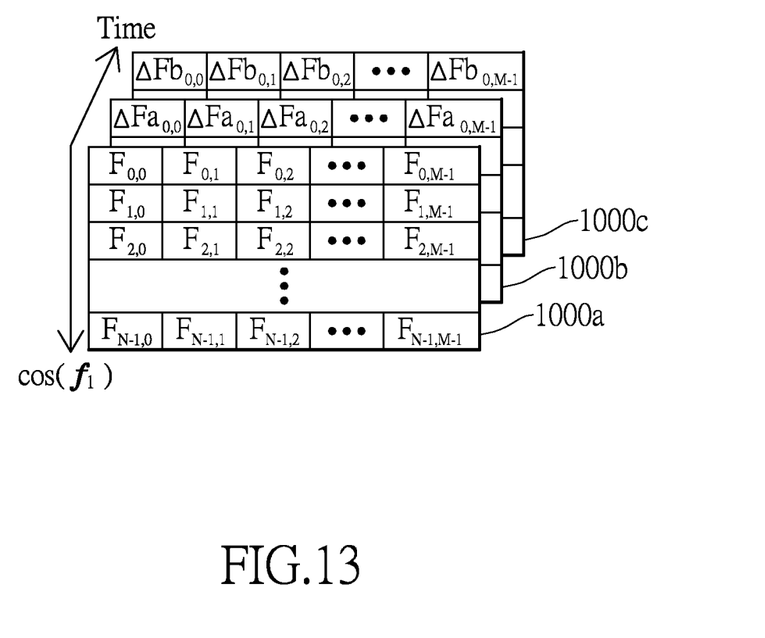
FIG. 13 is a schematic diagram of a distance differential data table transformed by a discrete cosine transform (DCT) of the third embodiment of the method for sampling and converting the vehicular network data of the present invention.

For example, with reference to FIG. 12 and FIG. 13, the last data in the distance data table 1000 is $D_{15,364}$, namely, N−1=15, M−1=364, and N=16, M=365. After N and M are brought into the formula, the data of the distance data table 1100a converted into the frequency domain can be obtained, for example, the last data $F_{15,364}$ is:

$$F_{15,364} = F(15, 364) = \sqrt{\frac{2}{16}} \sqrt{\frac{2}{365}}$$

$$\sum_{i=0}^{15} \sum_{j=0}^{364} C_U(15) C_V(364) \cos\left[\frac{15\pi}{32}(2i+1)\right] \cos\left[\frac{364\pi}{730}(2j+1)\right] D_{i,j}$$

$$C_U(u) = \begin{cases} \frac{1}{\sqrt{2}} & \text{if } u = 0 \\ 1 & \text{else} \end{cases}, \quad C_V(v) = \begin{cases} \frac{1}{\sqrt{2}} & \text{if } v = 0 \\ 1 & \text{else} \end{cases}$$

Therefore, the data $F_{0,0}$ to $F_{15,364}$ of the distance data table 1100a in the frequency domain each can be calculated.

The content data 9011 is each respectively corresponding to the time data. Further, the distance data tables 1000 can be each respectively established according to the content data 9011, and the reflection data tables 1100 can be each respectively established according to the content data 9011. Therefore, with reference to FIG. 10 and FIG. 11, the distance data tables 1000 can each respectively correspond to the time data $t_0$ to $t_2$, and the reflection data tables 1100 can each respectively correspond to the time data $t_0$ to $t_2$.

Moreover, the distance data tables 1000a, 1000b, 1000c in the frequency domain can also each respectively correspond to the time data $t_0$ to $t_2$. With reference to FIG. 13, when the vehicle host 11 differentially samples data in the data table, the vehicle host 11 uses the data in the distance data table 1000a in the frequency domain corresponding to the first time sequence $t_0$ as the reference, and the vehicle host 11 differentially samples the data in the distance data tables 1000b, 1000c corresponding to other time sequences $t_1$ and $t_2$ to generate the differential distance data tables 1000b, 1000c. Therefore, the amount of the data in the differential distance data tables 1000b, 1000c can be reduced.

For example, the data $\Delta Fa_{0,0}$ to $\Delta Fa_{N-1,M-1}$ in the distance data table 1000c corresponding to the time sequence $t_1$ can be shown as: $\Delta Fa_{0,0} = Fb_{0,0} - F_{0,0}$, $\Delta Fa_{0,1} = Fb_{0,1} - F_{0,1}$, ..., etc.

$Fb_{i,j}$ represents the original data in the distance data table 1000b in the frequency domain.

In addition, the vehicle host 11 can further determine whether the data in the differential distance data table 1000*a* and the differential reflectance data table are greater than a threshold value. The vehicle host 11 replaces the data which are less than the threshold value in the differential distance data table 1000*a* and the differential reflectance data table for 0. Therefore, the amount of the data in the differential distance data tables 1000*b*, 1000*c* can be further reduced.

Since the content data 9011 of the Lidar signal 900 each represents a plane scanned by the Lidar 15, the content data 9011 can allow a certain degree of distortion without affecting subsequent use. Namely, when the vehicle host 11 replaces the data which are less than the threshold value for 0, the data which are less than the threshold value are deleted, and a small portion of the plane scanned by the Lidar 15 will disappear. The data which are less than the threshold value may be noise or some tiny objects. Therefore, when the vehicle host 11 replaces the data which are less than the threshold value for 0, the amount of data can be further reduced without affecting the subsequent use of the data.

In summary, the present invention mainly uses differential sampling, or represents data by a frequency domain base. The important data can be retained in data whose amount is reduced. Therefore, the original data may not be necessary to be recorded or be compressed, and the amount of the data can be reduced to improve sampling rate of the vehicular network data.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A method for sampling and converting vehicular network data, comprising steps of:
    receiving an original signal; wherein the original signal includes a plurality of data signals;
    selecting one of the data signals from the original signal;
    establishing a data table according to the selected one of the data signals;
    determining whether the original signal includes any data signal remaining unselected;
    when the original signal includes any data signal remaining unselected, selecting another one of the data signals from the data signals of the original signal remaining unselected;
    when all of the data signals included in the original signal are selected, differentially sampling data in the data table corresponding to other time sequences by using the data in the data table corresponding to a first time sequence as a reference to generate a differential data table, compressing the differential data table, and uploading the compressed differential data table.

2. The method for sampling and converting the vehicular network data as claimed in claim 1, wherein the original signal is a Controller Area Network (CAN) signal.

3. The method for sampling and converting the vehicular network data as claimed in claim 2, wherein the step of establishing a data table according to the selected one of the data signals further comprises sub-steps of:
    decoding an identification data of the selected one of the data signals;
    determining whether the decoded identification data of the selected one of the data signals is stored in an identification data table;
    when the decoded identification data of the selected one of the data signals is stored in the identification data table, selecting a content data table corresponding to the decoded identification data, and storing time data and content data of the selected one of the data signals into the selected content data table.

4. The method for sampling and converting the vehicular network data as claimed in claim 3, wherein the step of establishing a data table according to the selected one of the data signals further comprises sub-steps of:
    when the decoded identification data of the selected one of the data signals is unsaved in the identification data table, storing the decoded identification data into the identification data table, establishing a new content data table corresponding to the decoded identification data, selecting the new content data table, and storing time data and content data of the selected one of the data signals into the selected content data table.

5. The method for sampling and converting the vehicular network data as claimed in claim 1, wherein the original signal is a Light Detection and Ranging (Lidar) signal.

6. The method for sampling and converting the vehicular network data as claimed in claim 5, wherein the step of establishing a data table according to the selected one of the data signals further comprises sub-steps of:
    establishing a distance data table and a reflectance data table corresponding to time data of the selected one of the data signals according to the selected one of the data signals.

7. The method for sampling and converting the vehicular network data as claimed in claim 6, wherein when all of the data signals included in the original signal are selected, the method further includes firstly transforming the distance data table and the reflectance data table according to Discrete Cosine Transform (DCT), secondly differentially sampling the distance data table and the reflectance data table corresponding to other time sequences by using the distance data table and the reflectance data table corresponding to a first time sequence as a reference to generate a differential distance data table and a differential reflectance data table, thirdly compressing the differential distance data table and the differential reflectance data table, and fourthly uploading the compressed differential distance data table and the compressed differential reflectance data table.

8. A system for sampling and converting vehicular network data, comprising:
    a vehicle bus, receiving an original signal; wherein the original signal includes a plurality of data signals;
    a vehicle host, electrically connected to the vehicle bus to receive the original signal, and selecting one of the data signals from the original signal; wherein the vehicle host further establishes a data table according to the selected one of the data signals, and determines whether the original signal includes any data signal remaining unselected;
    wherein when the original signal includes any data signal remaining unselected, the vehicle host selects another one of the data signals from the data signals of the original signal remaining unselected;
    wherein when all of the data signals included in the original signal are selected, the vehicle host differential samples data in the data table corresponding to other time sequences by using the data in the data table corresponding to a first time sequence as a reference to generate a differential data table, and compresses the differential data table;

a network module, electrically connected to the vehicle host; wherein when the vehicle host compresses the differential data table, the vehicle host further uploads the compressed differential data table to a cloud server.

9. The system for sampling and converting the vehicular network data as claimed in claim 8, wherein the original signal is a Controller Area Network (CAN) signal.

10. The system for sampling and converting the vehicular network data as claimed in claim 9, wherein when the vehicle host establishes the data table according to the selected one of the data signals, the vehicle host further decodes an identification data of the selected one of the data signals, and determines whether the decoded identification data of the selected one of the data signals is stored in an identification data table;

wherein when the decoded identification data of the selected one of the data signals is stored in the identification data table, the vehicle host selects a content data table corresponding to the decoded identification data, and stores time data and content data of the selected one of the data signals into the selected content data table.

11. The system for sampling and converting the vehicular network data as claimed in claim 10, wherein when the decoded identification data of the selected one of the data signals is unsaved in the identification data table, the vehicle host further stores the decoded identification data into the identification data table, establishes a new content data table corresponding to the decoded identification data, selects the new content data table, and stores time data and content data of the selected one of the data signals into the selected content data table.

12. The system for sampling and converting the vehicular network data as claimed in claim 8, further comprising:

a Light Detection and Ranging (Lidar), electrically connected to the vehicle host;

wherein the original signal is a Lidar signal generated by the Lidar.

13. The system for sampling and converting the vehicular network data as claimed in claim 12, wherein when the vehicle host establishes the data table according to the selected one of the data signals, the vehicle host further establishes a distance data table and a reflectance data table corresponding to time data of the selected one of the data signals according to the selected one of the data signals.

14. The system for sampling and converting the vehicular network data as claimed in claim 13, wherein when all of the data signals included in the original signal are selected, the vehicle host firstly transforms the distance data table and the reflectance data table according to Discrete Cosine Transform (DCT), secondly differentially samples the distance data table and the reflectance data table corresponding to other time sequences by using the distance data table and the reflectance data table corresponding to a first time sequence as a reference to generate a differential distance data table and a differential reflectance data table, thirdly compresses the differential distance data table and the differential reflectance data table, and fourthly uploads the compressed differential distance data table and the compressed differential reflectance data table to the cloud server.

* * * * *